United States Patent
Ying et al.

(10) Patent No.: US 9,692,395 B2
(45) Date of Patent: Jun. 27, 2017

(54) FREQUENCY DIVIDER, CLOCK GENERATING APPARATUS, AND METHOD CAPABLE OF CALIBRATING FREQUENCY DRIFT OF OSCILLATOR

(71) Applicant: MEDIATEK INC., Hsin-Chu (TW)

(72) Inventors: Yu-Ming Ying, Changhua County (TW); Shiue-Shin Liu, HsinChu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/067,141

(22) Filed: Mar. 10, 2016

(65) Prior Publication Data

US 2016/0197599 A1 Jul. 7, 2016

Related U.S. Application Data

(63) Continuation of application No. 14/048,035, filed on Oct. 7, 2013, now Pat. No. 9,344,065.

(60) Provisional application No. 61/716,646, filed on Oct. 22, 2012.

(51) Int. Cl.
  *H03K 3/013* (2006.01)
  *H03L 1/02* (2006.01)
  *H03L 7/197* (2006.01)
  *H03K 7/06* (2006.01)

(52) U.S. Cl.
  CPC ............. *H03K 3/013* (2013.01); *H03K 7/06* (2013.01); *H03L 1/022* (2013.01); *H03L 7/1974* (2013.01); *H03L 7/1976* (2013.01)

(58) Field of Classification Search
  CPC . H03K 2005/0013; H03K 2005/00143; H03K 3/0315; H03K 3/354; H03K 23/667; H03K 3/013
  USPC .......................... 327/113, 115, 156, 158, 161
  See application file for complete search history.

(56) References Cited

U.S. PATENT DOCUMENTS

| | | | |
|---|---|---|---|
| 7,227,423 B2 | 6/2007 | McCorquodale | |
| 7,227,424 B2 | 6/2007 | McCorquodale | |
| 7,248,124 B2 | 7/2007 | McCorquodale | |
| 2006/0049878 A1 | 3/2006 | Kawabe | |
| 2008/0164918 A1 | 7/2008 | Stockstad | |
| 2011/0133798 A1* | 6/2011 | Tsukio | H03J 7/065 327/156 |
| 2013/0099839 A1* | 4/2013 | Kao | H03L 7/1974 327/158 |

FOREIGN PATENT DOCUMENTS

CN 1679239 A 10/2005

* cited by examiner

*Primary Examiner* — John Poos
(74) *Attorney, Agent, or Firm* — Winston Hsu

(57) ABSTRACT

A clock generating apparatus includes an oscillator and a frequency synthesizer. The oscillator is utilized for generating a reference clock signal. The frequency synthesizer is coupled to the oscillator and utilized for synthesizing a target clock signal in accordance with the reference clock signal and a frequency division factor that has been adjusted or compensated, and outputting the target clock signal as an output of the clock generating apparatus.

19 Claims, 3 Drawing Sheets

FREQUENCY DIVIDER, CLOCK GENERATING APPARATUS, AND METHOD CAPABLE OF CALIBRATING FREQUENCY DRIFT OF OSCILLATOR

CROSS REFERENCE TO RELATED APPLICATION

This continuation application claims the benefit of U.S. application Ser. No. 14/048,035, which was filed on Oct. 7, 2013 and claims the benefit of U.S. Provisional Application No. 61/716,646, which was filed on Oct. 22, 2012.

BACKGROUND

In general, a conventional oscillator can be implemented by a variety of types of oscillators. For example, the conventional oscillator may include an LC resonator. Unfortunately, a frequency drift is often introduced due to the process variations or temperature changes. In order to calibrate the frequency drift, a conventional method is employed to adjust the capacitor array of the resonator (e.g. the LC resonator) of the oscillator, so as to obtain an accurate frequency. However, this may cause the design of the oscillator become more complex because the analog control approach is sensitive to PVT variation, especially in advanced process. Therefore, it is important to provide a novel scheme to simultaneously achieve high frequency accuracy and easy implementation by digital adjustments.

SUMMARY

Therefore one of the objectives of the present invention is to provide a fractional divider, a clock generating apparatus, and corresponding method to solve the above-mentioned problem. The fractional divider, clock generating apparatus, and corresponding method can simultaneously achieve high frequency accuracy and good jitter performance. Besides, the embedded crystal (XTAL) is low-cost for a competitive market.

According to an embodiment of the present invention, a clock generating apparatus is disclosed. The clock generating apparatus comprises an oscillator and a frequency synthesizer. The oscillator is used for generating a reference clock signal. The frequency synthesizer is coupled to the oscillator and utilized for synthesizing a target clock signal in accordance with the reference clock signal and a frequency division factor that has been adjusted or compensated, and outputting the target clock signal as an output of the clock generating apparatus.

According to an embodiment of the present invention, a method used for a clock generating apparatus is disclosed. The method comprises: providing an oscillator for generating a reference clock signal; synthesizing a target clock signal in accordance with the reference clock signal and a frequency division factor that has been adjusted or compensated; and, outputting the target clock signal as an output of the clock generating apparatus.

According to an embodiment of the present invention, a clock generating apparatus is disclosed. The clock generating apparatus comprises an oscillator and a phase control circuit. The oscillator is utilized for generating a reference clock signal. The phase control circuit is coupled to the oscillator and utilized for selecting at least two phase shifts from different phase characteristics that are generated based on the reference clock signal, and utilized for interpolating a phase shift according to the selected phase shifts, so as to generate a target clock signal.

According to another embodiment of the present invention, a fractional divider is disclosed. The fractional divider comprises a phase selector, a phase interpolator, and a sigma-delta modulator. The phase selector is utilized for selecting at least two phase shifts from different phase characteristics that are generated based on a reference clock signal provided by an oscillator. The phase interpolator is coupled to the phase selector and utilized for interpolating a phase shift according to the selected phase shifts, so as to generate a target clock signal having a frequency that is a frequency of the reference clock signal divided by a frequency division factor. The sigma-delta modulator is coupled to the phase selector and the phase interpolator, and is utilized for respectively controlling the phase selector and the phase interpolator to calibrate the frequency of the target clock signal by adjusting/compensating the frequency division factor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
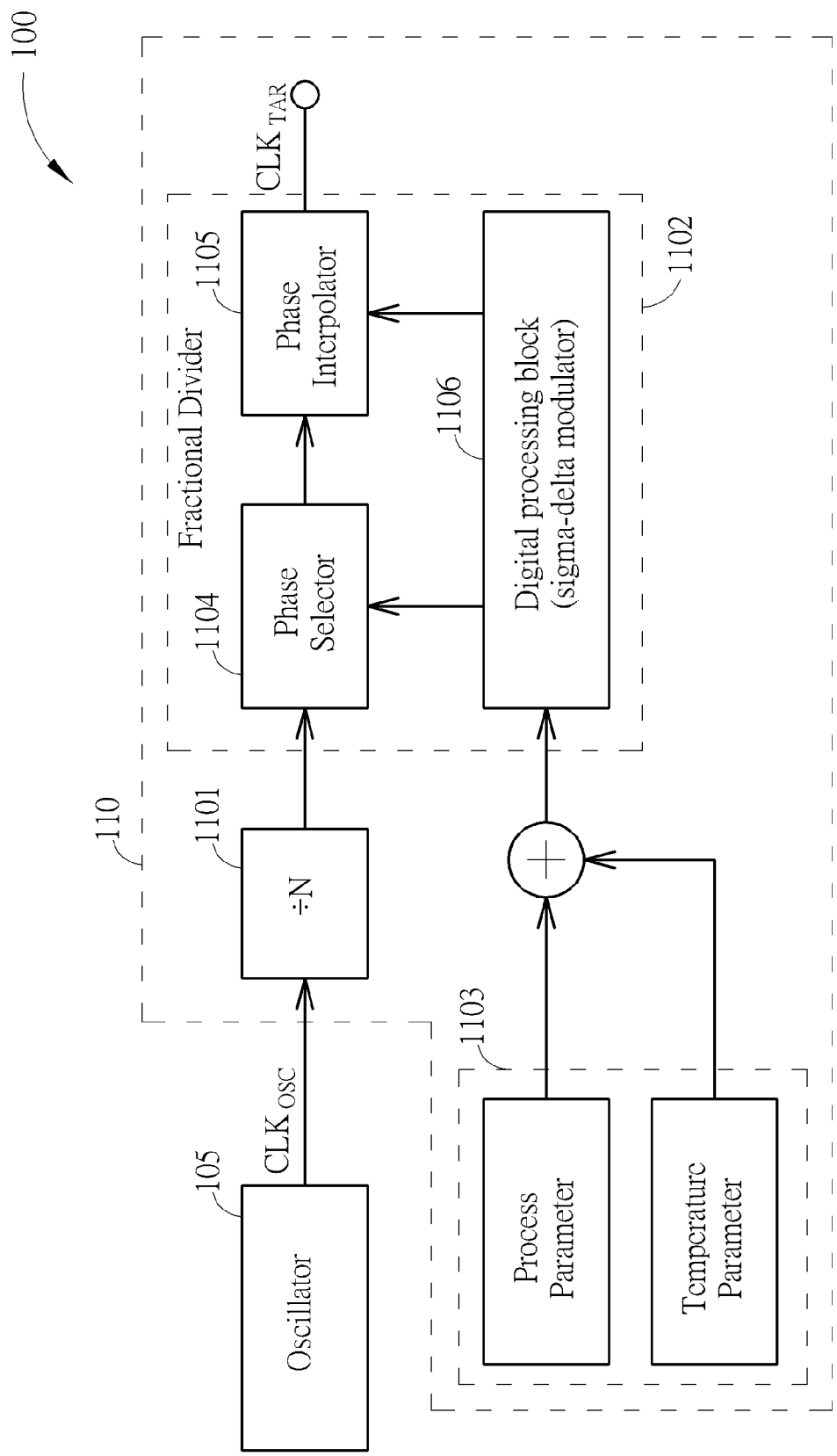
FIG. 1 is a block diagram of a clock generating apparatus according to an embodiment of the present invention.

Please refer to FIG. 1, which is a block diagram of a clock generating apparatus 100 according to an embodiment of the present invention. The clock generating apparatus 100 comprises an oscillator 105 and a frequency synthesizer 110. The frequency synthesizer 110 comprises a divider 1101, a fractional divider 1102, and a table 1103, and the fractional divider 1102 comprises a phase selector 1104, a phase interpolator 1105, and a digital processing block 1106. The clock generating apparatus 100 is an embedded crystal system-on-chip (SOC) circuit; that is, the clock generating apparatus 100 is installed on a single integrated circuit chip. The need of an on-board external crystal oscillator can thus be eliminated for an electric system. In addition, the clock generating apparatus 100 can be used for generating and outputting a target clock signal $CLK_{TAR}$ to a post-stage system (not shown in FIG. 1) according to an internal reference clock source, i.e. the oscillator 105. In addition, the clock generating apparatus 100 may be applied for a variety of applications such as wire-line communications, e.g. SATA (Serial ATA), USB, or Ethernet. This is not meant to be a limitation of the present invention.

The oscillator 105 can be implemented by an LC resonator (but not limited) or other type resonator such as the ring oscillator, and the oscillator 105 is used as a source reference resonator and utilized for generating a reference clock signal $CLK_{OSC}$ as a source clock signal. The frequency synthesizer 110 is utilized for receiving the reference clock signal $CLK_{OSC}$, synthesizing the target clock signal $CLK_{TAR}$ used as a system clock in accordance with the reference clock signal $CLK_{OSC}$ and a frequency division factor that has been adjusted or compensated, and outputting the target clock signal $CLK_{TAR}$ as an output of the clock generating apparatus 100. Specifically, the frequency synthesizer 110 is arranged to calibrate the frequency of the target clock signal $CLK_{TAR}$ by adjusting the frequency division factor (e.g. the frequency division factor of the fractional divider 1102) to compensate the target clock signal $CLK_{TAR}$ according to at least one of process variation information and temperature variation information which is stored in the table 1103.

In order to compensate variations of the frequency outputted by the oscillator 105 due to process variations and/or temperature variations, the fractional divider 1102 is arranged to adjust the frequency division factor based on the information stored in the table 1103, so as to compensate the frequency outputted by the divider 1101 to obtain the target clock signal $CLK_{TAR}$ having an accurate frequency. In other words, even though the frequency of the reference clock signal $CLK_{OSC}$ generated by the oscillator 105 may be slightly varied or drifted under different conditions, by adjusting the frequency division factor of the frequency synthesizer 110, the frequency synthesizer 110 can appropriately calibrate/compensate the varied/drifted frequency, so as to obtain the target clock signal $CLK_{TAR}$ having the accuracy frequency as the output of the clock generating apparatus 100. This achieves high frequency accuracy and low phase noise and jitter.

It should be noted that in this embodiment the components of the oscillator 105 are not altered to adjust the frequency of the reference clock signal $CLK_{OSC}$. For example, if the oscillator 105 is implemented by an LC resonator, then in this embodiment the capacitor or inductor components included by the LC resonator are not compensated to adjust the frequency of the reference clock signal $CLK_{OSC}$; or the LC resonator is equipped with a fixed, not switchable, capacitor array. That is, in this embodiment, the step of calibrating the frequency of the target clock signal $CLK_{TAR}$ is achieved by adjusting a frequency division factor of the frequency synthesizer 110 rather than adjusting the generation of the source reference clock signal $CLK_{OSC}$. However, this is not intended to be a limitation of the present invention. The reference clock signal $CLK_{OSC}$ may be coarse-tuned with adjustment of the components of the oscillator 105 while fine-tuned with adjustment of the frequency division factor of the frequency synthesizer 110.

The table 1103 is utilized for recording the process variation information and/or the temperature information. The process variation information includes a set of process parameters having different adjustments corresponding to different process fabrication variations, and the temperature variation information includes a set of temperature parameters corresponding to different temperature variation conditions. The set of process parameters are generated at the chip probing flow or at the final test flow that is used for checking circuit elements of the clock generating apparatus 100 during the manufacturer process before or after packaging, respectively. The process parameters are generated before the oscillator 105 is employed for generating the reference clock signal $CLK_{OSC}$. The generation of the process parameters may be based on an external machine system wherein the external machine system can generate an accurate frequency. The external machine system may be used to generate the process parameters according to the relation between different frequency drifts and process variations. After the relation is determined, the set of process parameters can be determined correspondingly and used for calibrating the frequency drift generated due to the process variation. This ensures that the frequency of reference clock signal $CLK_{OSC}$ can become more accurate. The set of process parameters are recorded by the table 1103 after the parameters are generated. The set of process parameters may correspond to a variety of variation information such as process corners (i.e. typical-typical (TT), fast-fast (FF), slow-slow (SS), fast-slow (FS), and slow-fast (SF)). The first letter of the process corner indicates NMOS elements and the second letter indicates PMOS elements. According to the process variation information, the frequency divider 110 can adjust the frequency division factor NF of the fractional divider 1102 to compensate the frequency of the reference clock signal $CLK_{OSC}$ by the adjusted frequency division factor NF, so as to appropriately calibrate/compensate the frequency of the target clock signal $CLK_{TAR}$. For example, if the process corner SS causes the frequency of the reference clock signal $CLK_{OSC}$ become lower, then the frequency division factor NF of the fractional divider 1102 may be adjusted to a smaller value according to a process parameter corresponding to the process corner SS, so as to calibrate the frequency of the reference clock signal $CLK_{OSC}$. Additionally, in another example, if the process corner FF causes the frequency of the reference clock signal $CLK_{OSC}$ become higher, then the frequency division factor NF of the fractional divider 1102 may be adjusted to a greater value according to a process parameter corresponding to the process corner FF, so as to calibrate the frequency of the reference clock signal $CLK_{OSC}$.

In addition, the set of temperature parameters are utilized with an on-chip temperature sensor (not shown in FIG. 1). The on-chip temperature sensor can be used to online monitor, measure, and record/collect the current temperature. The set of temperature parameters includes the relation of different adjustments corresponding to different temperature conditions including a normal temperature condition and other different temperature conditions, and the table 1103 is arranged to store the different adjustments. For example, the table 1103 is arranged to record different adjustment coefficients corresponding to different temperature conditions. The set of temperature parameters are used to calibrate a frequency drift of the oscillator 105 generated due to a temperature change. The relation between different adjustment coefficients and temperatures and the current temperature recorded by the on-chip temperature sensor are inputted to the fractional divider 1102. Accordingly, the fractional divider 1102 can obtain a corresponding temperature parameter at the current temperature to calibrate the frequency drift of the oscillator 105.

It should be noted that the temperature parameters and process parameters are independent to each other. The operation for calibrating the frequency drift according to the process parameters is independent from the operation for calibrating the frequency drift according to the temperature parameters. In the preferred embodiment, both of the operations are applied for obtaining a more accurate frequency. However, in other embodiments, may be only the process parameters or only the temperature parameters are applied to obtain an accurate frequency. This modification also obeys the spirit of the present invention. That is, it is helpful to employ either the process parameters or the temperature parameters to calibrate the frequency drift.

In this embodiment, the digital processing block 1106 is arranged to receive the process parameters and the temperature parameters, and is arranged to determine the frequency division factor NF of the fractional divider 1102 according to the process parameters and temperature parameters. The digital processing block 1106 is arranged to select a process parameter from the set of process parameters or a temperature parameter from the set of temperature parameters by referring to a current fabrication process or a current temperature, and is arranged to determine/adjust the division factor NF by utilizing the selected process parameter or selected temperature parameter. The division factor NF is a positive value having a decimal number. After determining the frequency division factor NF, the digital processing block 1106 is arranged to control the analog circuits (e.g. the phase selector 1104 and phase interpolator 1105) to generate and output the calibrated signal $CLK_{TAR}$ having an accurate frequency according to the determined frequency division factor NF. The digital processing block 1106 controls the phase selector 1104 and phase interpolator 1105 to generate the calibrated signal $CLK_{TAR}$ having a precise phase shift, so as to obtain the accurate frequency. The divider 1101 provides multiple clock signals having different phase characteristics (or different phase shift adjustments) according to the reference clock signal $CLK_{OSC}$ outputted from the oscillator 105. The phase selector 1104 is arranged to select two phase shifts from the phase characteristics or phase shift adjustments, and the phase interpolator 1105 is arranged to interpolate the appropriate phase shift corresponding to the accurate frequency based on the selected phase shifts. For example, the phase selector 1104 may be used to select two phase shifts from zero degrees, 90 degrees, 180 degrees, and 270 degrees. If the phase shift to be interpolated by the phase interpolator 1105 is 45 degrees, then the phase selector 1104 selects zero degrees and 90 degrees, and the phase interpolator 1105 generates 45 degrees based on the zero degrees and 90 degrees by the phase interpolation operation. This example is merely used for illustrative purposes, and is not intended to be a limitation of the present invention. For example, the phase selector 1104 and the phase interpolator 1105 may be merged as a circuit block for some design options.

In addition, the sigma-delta modulation (SDM) technique can be used to apply to the digital processing block 1106 to increase the frequency resolution. SDM noise can be effectively suppressed by the phase interpolator 1105. Thus, the noise generated in the clock generating apparatus 100 can be dominated by the oscillator 105 rather than the SDM technique. The whole system performance can be improved significantly. In another embodiment, the frequency synthesizer 110 may include two or more fractional dividers so as to provide a higher resolution.

Figure 2:
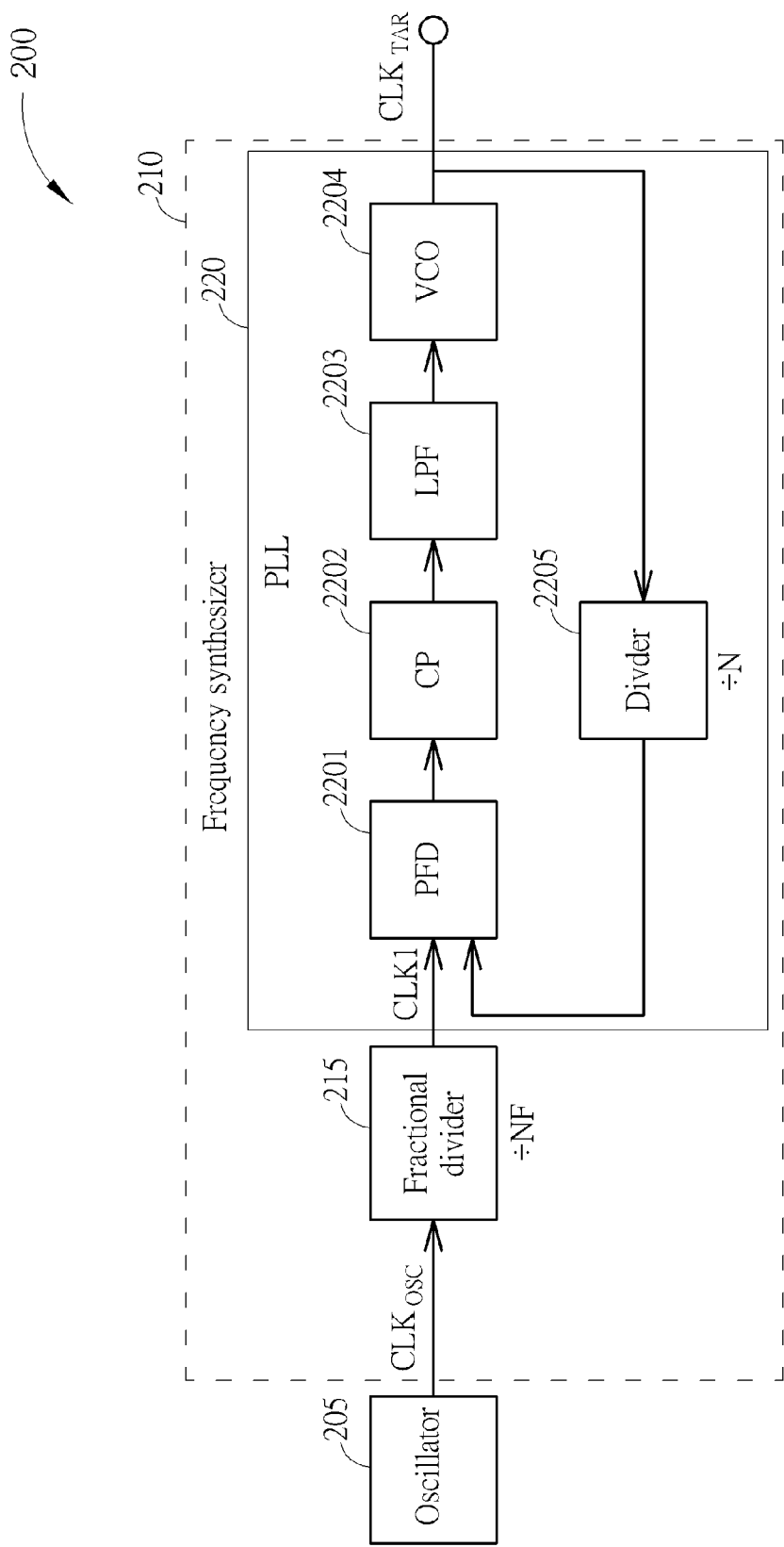
FIG. 2 is a block diagram of a clock generating apparatus according to another embodiment of the present invention.

Please refer to FIG. 2, which is a block diagram of a clock generating apparatus 200 according to another embodiment of the present invention. As shown in FIG. 2, the clock generating apparatus 200 comprises an oscillator 205 and a frequency synthesizer 210, and the frequency synthesizer 210 comprises a fractional divider 215 having the division factor NF and a phase-locked loop (PLL) 220. The PLL 220 comprises a phase frequency detector (PFD) 2201, a charge-pump (CP) 2202, a low-pass-filer (LPF) 2203, a voltage-controlled oscillator (VCO) 2204, and a divider 2205 having a constant integer division factor N on the feedback path. The fractional divider 215 is used for generating a clock signal CLK1 by using the division factor NF according to the reference clock signal $CLK_{OSC}$, wherein NF is a positive value having a decimal number. The operation of the fractional divider 215 is similar to that of the fractional divider 1102 shown in FIG. 1. That is, the fractional divider 215 is arranged to adjust the division factor NF by referring to the at least one of the process variation information and the temperature variation information (i.e. the process parameters or the temperature parameters), to calibrate/compensate the frequency drift of the oscillator 205, and to obtain the accurate frequency of the target clock signal $CLK_{TAR}$. Detail description is not described again for brevity. However, the circuit structure of the fractional divider 215 is not limited to be the same as that of the fractional divider 1102. Other circuit structures capable of providing division factor adjustment shall be also applicable. The target clock signal $CLK_{TAR}$ outputted by the clock generating apparatus 200 is designed to be a system clock signal. The PLL 220 is arranged to receive the clock signal CLK1 and synthesize the target clock signal $CLK_{TAR}$ based on the clock signal CLK1. Since the clock signal CLK1 is low-noise and stable against PVT variations, the divider 2205 having the constant integer division factor N on the feedback path is not arranged to calibrate or compensate the frequency drift generated due to the oscillator 205. The PLL 220 is not arranged to calibrate the frequency drift generated due to the oscillator 205.

In addition, as shown in FIG. 2, FIG. 2 discloses and depicts the circuit structure of frequency synthesizer 210. That is, the operation of the fractional divider 215 is not limited to adjusting the division factor NF by referring to the at least one of the process variation information and the temperature variation information. In another embodiment, the fractional divider 215 can be arranged to adjust the division factor NF by referring to other type information, to calibrate/compensate the frequency drift of the oscillator 205, and the PLL 220 is also arranged to receive the clock signal CLK1 and synthesize the target clock signal $CLK_{TAR}$ based on the clock signal CLK1, so as to obtain the accurate frequency of the target clock signal $CLK_{TAR}$. This modification should obey the spirit of the present invention.

Figure 3:
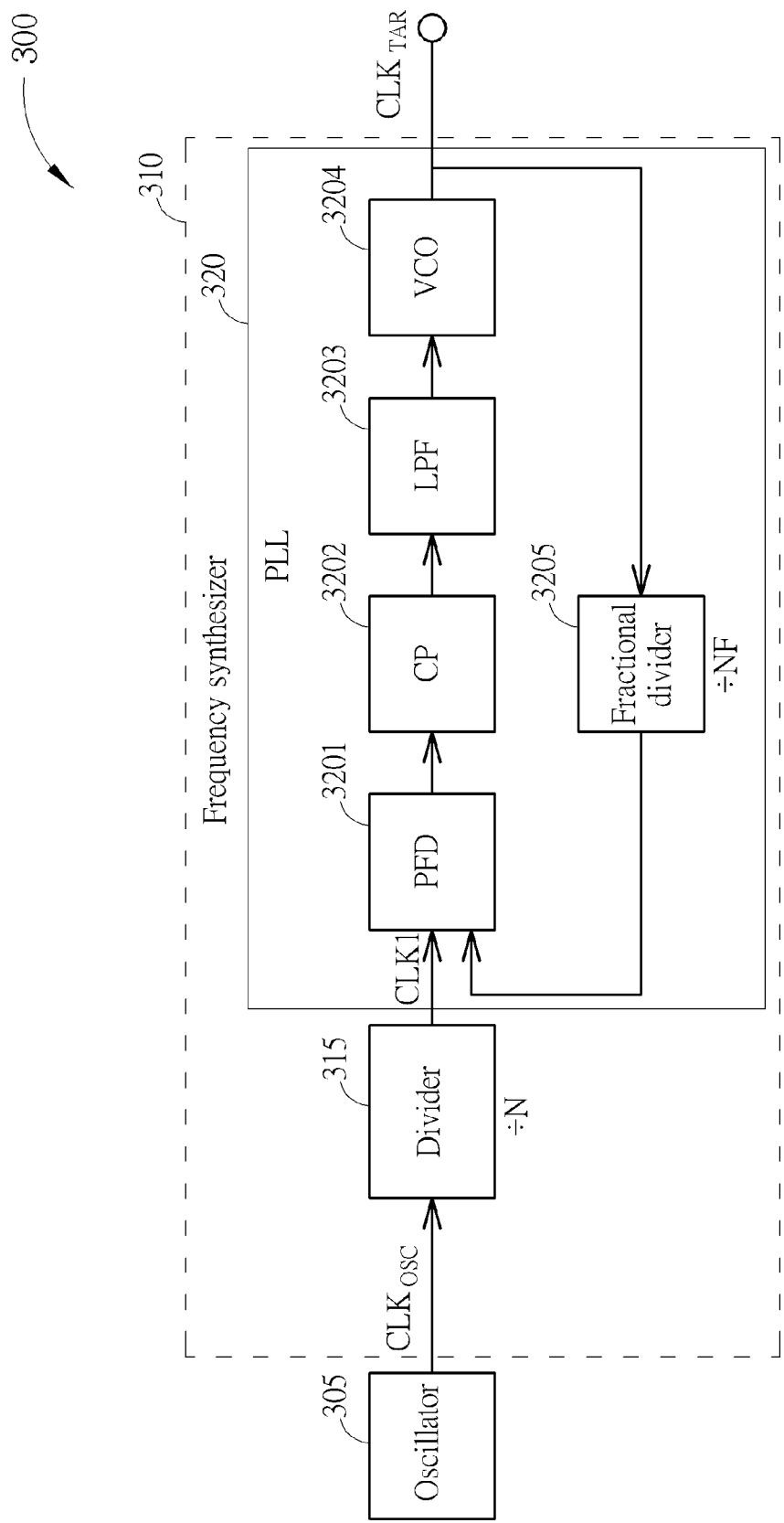
FIG. 3 is a block diagram of a clock generating apparatus according to another embodiment of the present invention.

Please refer to FIG. 3, which is a block diagram of a clock generating apparatus 300 according to another embodiment of the present invention. The embodiment of FIG. 3 is a modification of the embodiment of FIG. 2. As shown in FIG. 3, the clock generating apparatus 300 comprises an oscillator 305 and a frequency synthesizer 310, and the frequency synthesizer 310 comprises a divider 315 having a constant integer division factor N and a PLL 320. The PLL 320 comprises a PFD 3201, CP 3202, LPF 3203, VCO 3204, and a fractional divider 3205 having a division factor NF on the feedback path of the PLL 320. The division factor NF is a positive value having a decimal number. The divider 315 is arranged to generate a clock signal CLK1 by using the constant division factor N according to the reference clock signal $CLK_{OSC}$ generated by the oscillator 305. The divider 315 is not arranged to calibrate/compensate the frequency drift of the oscillator 305 generated due to process variation or temperature variation. The PLL 320 is arranged to receive the clock signal CLK1 and synthesize the target clock signal $CLK_{TAR}$ based on the clock signal CLK1. The operation of the fractional divider 3205 is similar to that of the fractional divider 1102 shown in FIG. 1. That is, the fractional divider 3205 is arranged to adjust the division factor NF by referring to the at least one of the process variation information and the temperature variation information (i.e. the process parameters or the temperature parameters), to calibrate/compensate the frequency drift of the oscillator 305, compensate the frequency of the clock signal CLK1, and to obtain the accurate frequency of the target clock signal $CLK_{TAR}$. Detail description is not described again for brevity. In other words, the PLL 320 is arranged to adjust or compensate the division factor NF by referring to the at least one of the process variation information and the temperature variation information, so as to obtain the accurate frequency of the target clock signal $CLK_{TAR}$ and outputting the target clock signal $CLK_{TAR}$ as the output of the clock generating apparatus 300. However, the circuit structure of the fractional divider 3205 is not limited to be the same as that of the fractional divider 1102. Other circuit structures capable of providing division factor adjustment shall be also applicable. The operation of the fractional divider 3205 is not limited to adjusting the division factor NF by referring to the at least one of the process variation information and the temperature variation information. In another embodiment, the fractional divider 3205 can be arranged to adjust the division factor NF by referring to other type information, to calibrate/compensate the frequency drift of the oscillator 305, so as to obtain the accurate frequency of the target clock signal $CLK_{TAR}$. This modification should obey the spirit of the present invention.

In addition, in the above embodiments, for an optional design, a multiplexer may be employed to select one from an internal clock signal and an external clock signal. The employed multiplexer can be placed between an oscillator and a divider. For example, the multiplexer may be placed between the oscillator 205 and the fractional divider 215 shown in FIG. 2, and is arranged to receive an internal clock signal (i.e. the signal $CLK_{OSC}$) and an external clock signal generated from an external oscillator. The output of the multiplexer is connected to the input of the fractional divider 215, and the multiplexer can be used to select either the clock signal $CLK_{OSC}$ or the external clock signal as an output.

To solve the problem caused by the frequency drift of the oscillator 105/205/305 under different conditions (the proposed compensation scheme may be extended to compensate conditions other than process and temperature variations), in the embodiments of the present invention, this is achieved by adjusting the division factor NF of a fractional divider without adjusting the oscillator 105/205/305. For example, if the oscillator 105/205/305 is a LC resonator, it is not necessary to adjust inductors or capacitors included within the LC resonator to calibrate the frequency drift; therefore the LC resonator can be equipped with a fixed, not switchable, capacitor array. Thus, a complex oscillator circuit design is not required. The implementation becomes easier due to digital processing.

Moreover, the clock generating apparatus 100/200/300 can be a system-on-chip (SOC) circuit; that is, the clock generating apparatus 100/200/300 can be installed on a single integrated circuit chip. The need of an on-board external crystal oscillator can then be eliminated for an electric system. Cost of the external crystal components can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generating apparatus, comprising:
an oscillator, for generating a reference clock signal; and
a fractional divider, directly or indirectly coupled to the oscillator, for receiving the reference clock signal and outputting a target clock signal, wherein the target clock signal is adjusted according to at least a process related parameter and/or at least a temperature related parameter, wherein the fractional divider is an open-loop circuit, the at least a process related parameter corresponding to process fabrication information, the at least a temperature related parameter corresponding to temperature condition information;
wherein the fractional divider includes a phase control circuit having a phase selector and a phase interpolator, wherein the phase selector selects at least two phase shifts from different phase characteristics generated based on the reference clock signal, and the phase interpolator further interpolates the selected phase shifts to generate the target clock signal.

2. The clock generating apparatus of claim 1, wherein the phase control circuit further comprises:
a sigma-delta modulator (SDM) coupled to the phase selector and the phase interpolator, for respectively controlling the phase selector and the phase interpolator based on the process related parameter and/or the temperature related parameter.

3. The clock generating apparatus of claim 1, wherein the fractional divider is incorporated or further coupled to a frequency synthesizer.

4. The clock generating apparatus of claim 3, wherein the frequency synthesizer includes a phase frequency detector, and the target clock signal outputted from the fractional divider is further inputted to the phase frequency detector.

5. The clock generating apparatus of claim 1, wherein the fractional divider includes a digital processing block arranged to determine a frequency division factor based on the process related parameter and/or the temperature related parameter.

6. The clock generating apparatus of claim 5, wherein the digital processing block is arranged to select the process related parameter from a set of process parameters and/or the temperature parameter from a set of temperature related parameters by referring to a current fabrication process or a current temperature.

7. The clock generating apparatus of claim 6, further comprising:
a table recording the set of process related parameters and/or the set of temperature related parameters.

8. The clock generating apparatus of claim 1, being installed on a single integrated circuit chip.

9. The clock generating apparatus of claim 1, wherein the oscillator includes a LC resonator.

10. A clock generating apparatus, comprising:
an oscillator, for generating a reference clock signal; and
a fractional divider, directly or indirectly coupled to the oscillator, for receiving the reference clock signal and outputting a target clock signal, wherein the target clock signal is adjusted according to at least a process related parameter and/or at least a temperature related parameter, the at least a process related parameter corresponding to process fabrication information, the at least a temperature related parameter corresponding to temperature condition information;
wherein the fractional divider includes a phase control circuit having a phase selector and a phase interpolator, wherein the phase selector selects at least two phase shifts from different phase characteristics generated based on the reference clock signal, and the phase interpolator further interpolates the selected phase shifts to generate the target clock signal.

11. The clock generating apparatus of claim 10, wherein the fractional divider is an open loop circuit.

12. The clock generating apparatus of claim 10, wherein the fractional divider is not a PLL circuit.

13. The clock generating apparatus of claim 10, wherein the fractional divider does not have a feedback path.

14. The clock generating apparatus of claim 10, wherein the phase control circuit further comprises:

a sigma-delta modulator (SDM) coupled to the phase selector and the phase interpolator, for respectively controlling the phase selector and the phase interpolator based on the process related parameter and/or the temperature related parameter.

15. The clock generating apparatus of claim 10, wherein the fractional divider is incorporated or further coupled to a frequency synthesizer.

16. The clock generating apparatus of claim 15, wherein the frequency synthesizer includes a phase frequency detector, and the target clock signal outputted from the fractional divider is further inputted to the phase frequency detector.

17. The clock generating apparatus of claim 10, wherein the fractional divider includes a digital processing block arranged to determine a frequency division factor based on the process related parameter and/or the temperature related parameter.

18. The clock generating apparatus of claim 10, being installed on a single integrated circuit chip.

19. The clock generating apparatus of claim 10, wherein the oscillator includes a LC resonator.

\* \* \* \* \*